(12) United States Patent
Hong et al.

(10) Patent No.: US 8,664,515 B2
(45) Date of Patent: Mar. 4, 2014

(54) SOLAR CONCENTRATOR

(75) Inventors: Chau-Nan Hong, Tainan (TW);
Shu-Chun Chu, Tainan (TW);
Wang-Chieh Yu, Tainan (TW);
Shan-Bin Chang, Tainan (TW);
Min-Hsiung Hon, Tainan (TW)

(73) Assignee: National Cheng Kung University, Tainan (TW)

( * ) Notice: Subject to any disclaimer, the term of this patent is extended or adjusted under 35 U.S.C. 154(b) by 758 days.

(21) Appl. No.: 12/724,402

(22) Filed: Mar. 15, 2010

(65) Prior Publication Data

US 2010/0229920 A1 Sep. 16, 2010

(30) Foreign Application Priority Data

Mar. 16, 2009 (TW) ............................. 98108494 A
Sep. 7, 2009 (TW) ............................. 98130094 A (51) Int. Cl.
*H01L 31/0232* (2006.01)

(52) U.S. Cl.
USPC ............. 136/246; 136/259; 136/258; 438/69; 438/72

(58) Field of Classification Search
USPC ................................. 136/244–265
See application file for complete search history.

(56) References Cited

U.S. PATENT DOCUMENTS

| 4,131,984 A * | 1/1979 | Kaplow et al. ............... 438/80 |
| 5,356,488 A * | 10/1994 | Hezel ............................. 136/256 |
| 5,503,898 A * | 4/1996 | Lauf ............................. 428/149 |
| 6,252,155 B1 * | 6/2001 | Ortabasi ....................... 136/246 |
| 7,355,114 B2 * | 4/2008 | Ojima et al. .................. 136/243 |
| 2001/0017154 A1 * | 8/2001 | Washio ........................ 136/256 |
| 2001/0050103 A1 * | 12/2001 | Washio ........................ 136/256 |
| 2002/0000244 A1 * | 1/2002 | Zaidi ............................ 136/259 |
| 2003/0111105 A1 * | 6/2003 | Tsukuda et al. ............. 136/251 |
| 2003/0213514 A1 * | 11/2003 | Ortabasi ....................... 136/246 |
| 2005/0098205 A1 | 5/2005 | Roscheisen et al. |
| 2006/0213548 A1 * | 9/2006 | Bachrach et al. ............. 136/251 |

FOREIGN PATENT DOCUMENTS

TW M324786 1/2008

* cited by examiner

*Primary Examiner* — Jayne Mershon
(74) *Attorney, Agent, or Firm* — CKC & Partners Co., Ltd.

(57) ABSTRACT

A solar concentrator is described. The solar concentrator includes a plane including a plurality of concentrating elements, wherein each concentrating element includes a hollow taper including a first opening; and at least one photoelectric conversion layer covering inner side surfaces of the concentrating elements.

5 Claims, 12 Drawing Sheets

SOLAR CONCENTRATOR

RELATED APPLICATIONS

This application claims priority to Taiwan Application Serial Number 98108494, filed Mar. 16, 2009 and Taiwan Application Serial Number 98130094, filed Sep. 7, 2009, which are herein incorporated by reference.

FIELD OF THE INVENTION

The present invention relates to a solar device, and more particularly to a solar concentrator.

BACKGROUND OF THE INVENTION

As the earth resources are wasted and the technology is developed, the shortage of the international energy resources is induced. In view of this, various countries in the world positively invest in the development of various alternative sources of energy. Among the alternative sources of energy, because sunlight is inexhaustible in supply and always available for use, it pays close attention to the development of solar energy apparatus for generating electric power, such as a solar cell.

A solar cell is a renewable energy that can directly generate electric power by the interaction of the sunlight and semiconductor materials. The solar cell will not discharge any gas, which includes $SiO_2$, so that the solar cell is a green power without pollution and can improve the problem of the earth's greenhouse effect.

The solar cell directly absorbs sunlight to generate electric power by using the photoelectric effect of the semiconductor. The principle of generating electric power of the solar cell is that when the sunlight irradiates the solar cell, the solar cell absorbs the energy from the sunlight to make a p-type semiconductor and an n-type semiconductor of the solar cell respectively generate electrons and holes, and to separate the electrons and the holes to form a voltage drop to generate current.

Figure 1A:
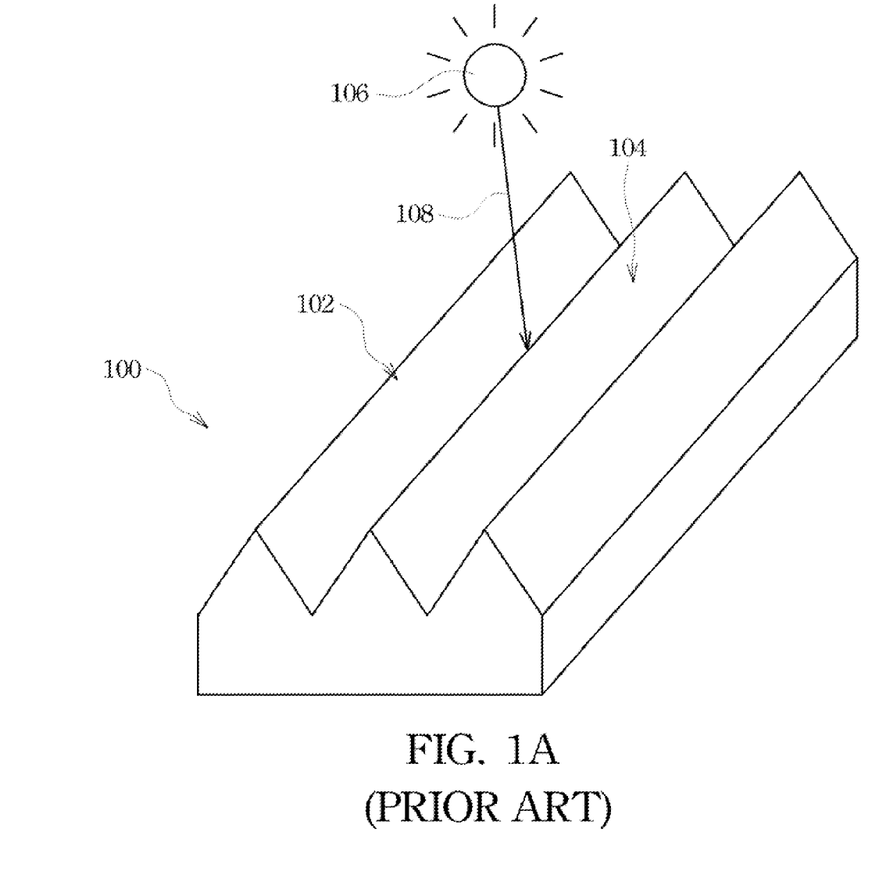
FIG. 1A is a schematic diagram showing the collecting of light of a conventional solar concentrator.

In order to increase the light-absorbing ability of the solar cell, a current method is to modify the design of a solar concentrator of the solar cell. Refer to FIG. 1A. FIG. 1A is a schematic diagram showing the collecting of light of a conventional solar concentrator. An entire surface 102 of a conventional solar concentrator 100 is set with a plurality of trenches 104. When the sun irradiates the surface 102 of the solar concentrator 100, the incident sunlight 108 can be guided downward by the trenches 104 to increase the energy absorptivity for the sunlight 108.

Figure 1B:
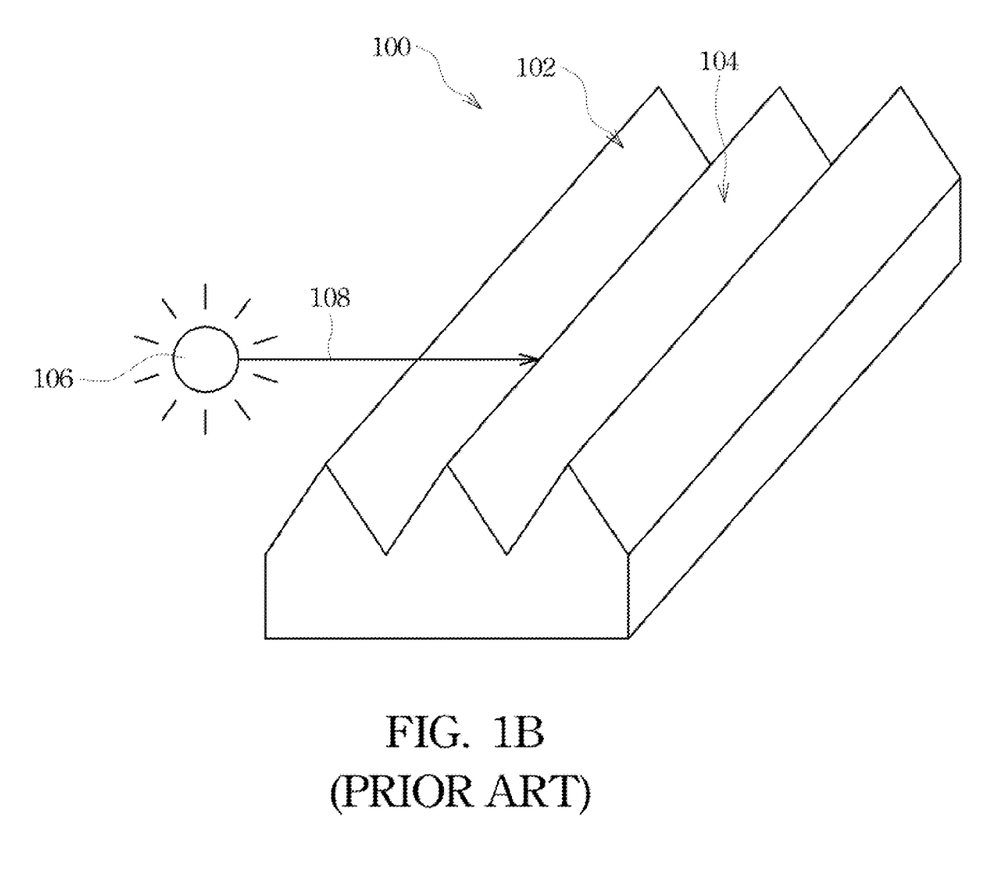
FIG. 1B is a schematic diagram showing the collecting of light of a conventional solar concentrator at another angle.

However, as shown in FIG. 1B, when the sunlight 108 is at a low angle relative to the surface 102 of the solar concentrator 100, the sunlight 108 cannot be effectively guided downward by the trenches 108 of the surface 102 of the solar concentrator 100. Therefore, when the sunlight 108 is at a low angle, the conventional solar concentrator 100 cannot achieve a good light-collecting effect.

Therefore, as the shortage of the energy resources is induced, a solar concentrator having a high light-collecting effect is needed to increase the light-absorbing efficiency of a solar cell for the energy of the sunlight.

SUMMARY OF THE INVENTION

Therefore, one aspect of the present invention is to provide a solar concentrator, in which its plane includes a plurality of concentrating elements, and each concentrating element includes a hollow taper. With the design of the hollow taper, the range of collecting the incident light can be enlarged, so that the solar concentrator has a very superior light-collecting ability.

Another aspect of the present invention is to provide a solar concentrator, which includes a plurality of concentrating elements, and each concentrating element includes a hollow taper and a hollow pillar communicating with each other, so that the range of collecting the incident light can be broadened, thereby greatly increasing the light-absorbing effect.

Still another aspect of the present invention is to provide a solar concentrator, in which each concentrating element of the solar concentrator includes a U-like shaped trench or a W-shaped trench. Two sidewalls of each of the U-like shaped trench and the W-shaped trench can increase the range of collecting the incident light of the solar concentrator, and can guide the incident light toward a bottom of the trench to increase the collision frequency between the incident light and a photoelectric conversion layer of the solar concentrator. Therefore, the light-absorbing efficiency can be increased to effectively enhance the photoelectric conversion efficiency.

Further another aspect of the present invention is to provide a solar concentrator, which includes at least one concentrating element, and each concentrating element includes a taper, wherein a light-entering surface and a light-concentrating surface are respectively disposed on different side surfaces of the taper. With the design of the taper, the range of collecting the incident light can be enlarged, so that the solar concentrator has a very superior light-collecting ability.

Yet another aspect of the present invention is to provide a solar concentrator, in which each concentrating element of the solar concentrator includes a pillar, and two opposite sides of each concentrating element include a light-entering surface and a plurality of light-concentrating surfaces. With the design of the pillar, the range of collecting the incident light can be broadened, and the incident light can be guided toward the light-concentrating surfaces on another side to increase the collision frequency between the incident light and an photoelectric conversion layer of the solar concentrator. Therefore, the light-absorbing efficiency can be increased to effectively enhance the photoelectric conversion efficiency. Accordingly, the solar concentrator of the present invention has a large collecting range of the incident light and a very superior light-absorbing effect.

According to the aforementioned aspects, the present invention provides a solar concentrator. The solar concentrator includes a plane and at least one photoelectric conversion layer. The plane includes a plurality of concentrating elements, wherein each concentrating element includes a hollow taper, and each hollow taper includes a first opening. The photoelectric conversion layer covers inner side surfaces of the concentrating elements.

According to one embodiment of the present invention, the plane is a monolithic structure.

According to the aforementioned aspects, the present invention provides a solar concentrator. The solar concentrator includes a transparent plane and at least one a photoelectric conversion layer. The transparent plane includes a plurality of concentrating elements. Each concentrating element includes a hollow taper and a hollow pillar. The hollow taper has a first opening. The hollow pillar has a second opening and a third opening opposite to each other, wherein the second opening is correspondingly connected to the first opening. The photoelectric conversion layer covers inner side surfaces of the concentrating elements.

According to one embodiment of the present invention, a height of each hollow pillar may be equal to any value. When the height of the hollow pillar is zero, and i.e. the concentrating element only includes the hollow taper, an angle φ of each taper tip may be less than 90 degrees. When the height of the hollow pillar is greater than zero, the angle φ of each taper tip may be equal to any value.

According to the aforementioned aspects, the present invention further provides a solar concentrator. The solar concentrator includes a plane and at least one a photoelectric conversion layer. The plane includes a plurality of concentrating elements, wherein each concentrating element includes a trench. Each trench includes a concave and two sidewalls, wherein the two sidewalls are respectively connected to two opposite sides of the concave and are opposite to each other. The photoelectric conversion layer covers inner side surfaces of the concentrating elements.

According to one embodiment of the present invention, each trench is a U-like shaped trench or a W-shaped trench.

According to the aforementioned aspects, the present invention further provides a solar concentrator including at least one concentrating element and a photoelectric conversion layer. The concentrating element includes a taper including a light-entering surface and at least one light-concentrating surface adjacent to the light-entering surface. The photoelectric conversion layer covers the light-concentrating surface.

According to one embodiment of the present invention, the taper is a triangular pyramid, a quadrangular pyramid or a polygonal pyramid.

According to the aforementioned aspects, the present invention further provides a solar concentrator including at least one concentrating element and a photoelectric conversion layer. The concentrating element includes at least one pillar including a light-entering surface and a plurality of light-concentrating surfaces, wherein the light-entering surface and the light-concentrating surfaces are located on two opposite sides of the concentrating element. The photoelectric conversion layer covers the light-concentrating surfaces.

According to one embodiment of the present invention, the light-concentrating surfaces form a W-shaped contour, a U-like shaped contour or a V-shaped contour.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

Figure 2:
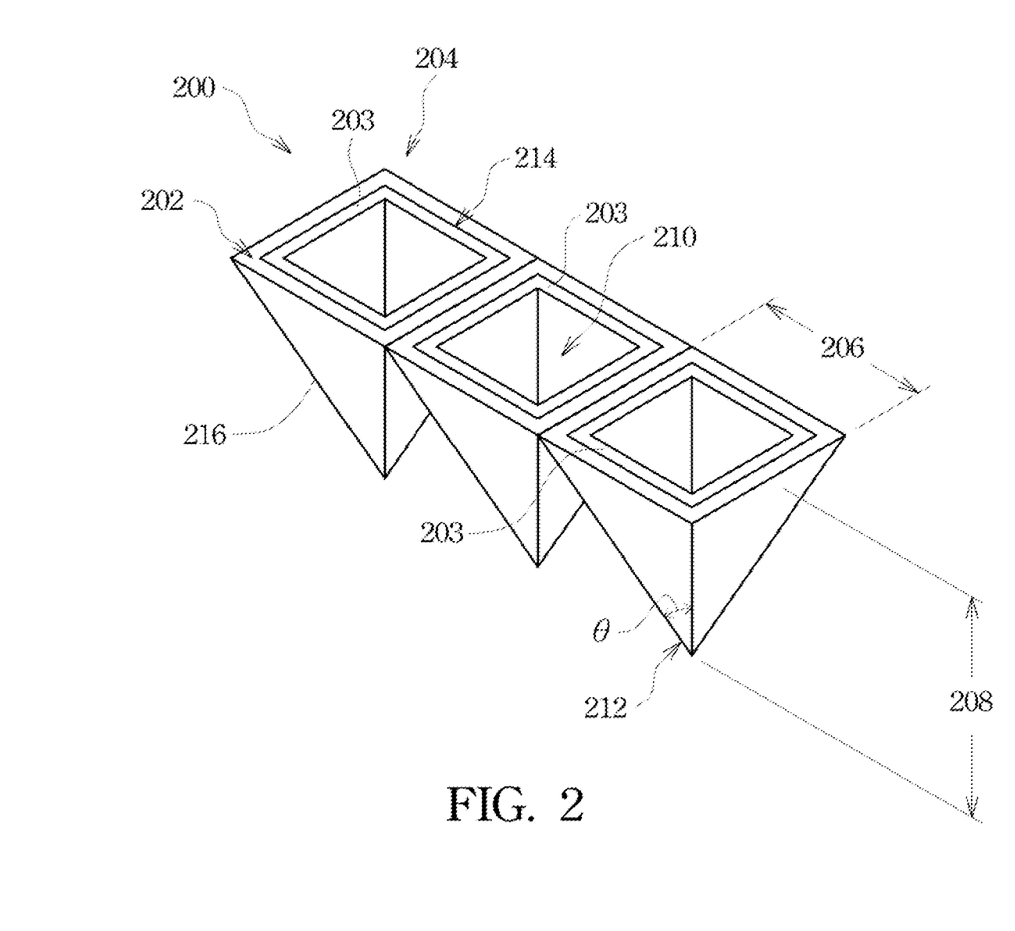
FIG. 2 is a three-dimensional drawing of a solar concentrator in accordance with an embodiment of the present invention.

Refer to FIG. 2. FIG. 2 is a three-dimensional drawing of a solar concentrator in accordance with an embodiment of the present invention. In the exemplary embodiment, a solar concentrator 200 of a solar cell mainly includes a plane 202. The material of the plane 202 may be any material, such as glass, a steel material or a plastic material. The plane 202 includes a plurality of concentrating elements 204. An inner side surface of each concentrating element 204 is covered with one or more photoelectric conversion layers 203. The photoelectric conversion layer 203 has an ability of absorbing light to generate electric energy. In one embodiment, the plane 202 may be a monolithic structure, and the concentrating elements 204 are formed in the plane 202. In another embodiment, the plane 202 is not a monolithic structure and is formed by combining the concentrating elements 204.

Each concentrating element 204 includes a hollow taper 216, wherein each hollow taper 216 has an opening 210. In one embodiment, the openings 210 of the hollow tapers 216 may be substantially on the same level. For example, the openings 210 of all hollow tapers 216 are located on the same surface 214 of the plane 202, such as shown in FIG. 2. An angle θ of each hollow taper 216 must be less than 90 degrees. In addition, the opening 210 of each hollow taper 216 may be in any shape, such as a square, a rectangular or a hexagon.

In the present embodiment, each hollow taper 216 includes a taper tip 212. The angle θ of each taper tip 212 may be, for example, less than substantially 90 degrees and greater than 0 degree. In one embodiment, the hollow taper 216 may be one of pyramids of different shapes, such as a hollow quadrangular pyramid shown in FIG. 2, a hollow triangular pyramid or a hollow polygon pyramid. The lengths of the sides of each pyramid may be the same or may be different, i.e. the pyramids may be regular pyramids or irregular pyramids. In another embodiment, the hollow taper 216 may be a hollow cone or a hollow elliptic cone.

Each concentrating element 204 of the solar concentrator 200 is composed of the hollow taper 216, so that when the incident light, such as sunlight, is at a low angle relative to the surface 214 of the plane 202, the incident light can be guided downward to make the incident light collide with the photoelectric conversion layers 203 many times to enhance the light-absorbing efficiency, so as to broaden the effective collecting range of the incident light, thereby effectively increasing the photoelectric conversion efficiency.

Figure 3:
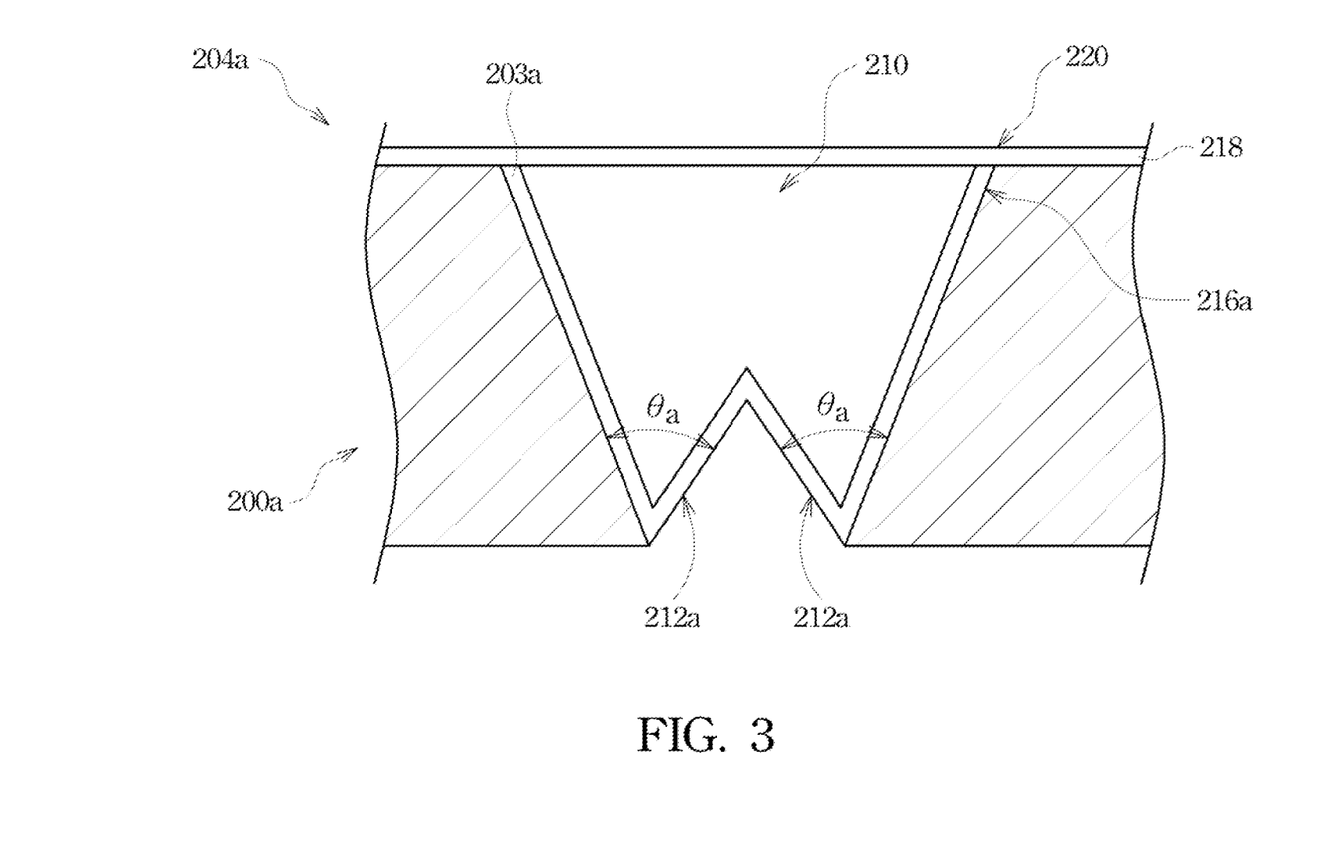
FIG. 3 illustrates a cross-sectional view of a concentrating element of a solar concentrator in accordance with another embodiment of the present invention.

In other embodiments, the hollow taper of the concentrating element of the solar concentrator may include at least two taper tips, and each taper tip may include any curved surface to polarize the light. Refer to FIG. 3. FIG. 3 illustrates a cross-sectional view of a concentrating element of a solar concentrator in accordance with another embodiment of the present invention. A concentrating element 204a of a solar concentrator 200a similarly includes a hollow taper 216a and at least one photoelectric conversion layer 203a, but the hollow taper 216a includes two taper tips 212a. The photoelectric conversion layer 203a similarly covers an inner side surface of the concentrating element 204a, i.e. an inner side surface of the hollow taper 216a. In one embodiment, an angle $\theta_a$ of each taper tip 212a of the hollow taper 216a may be, for example, less than substantially 90 degrees and greater than 0 degree.

In the present embodiment, in order to prevent the light-collecting ability of the concentrating element 204a of the solar concentrator 200a from being affected by the covering of dust, the solar concentrator 200a may selectively include a cover 218. The cover 218 covers all of the concentrating elements 204a to prevent the dust from falling into the hollow tapers 216a of the concentrating elements 204a. In one embodiment, a surface 220 of the cover 216 may be modified as an anti-reflective surface by using, for example, a surface treatment method to further enhance the light-collecting efficiency of the solar concentrator 200a.

Figure 4:
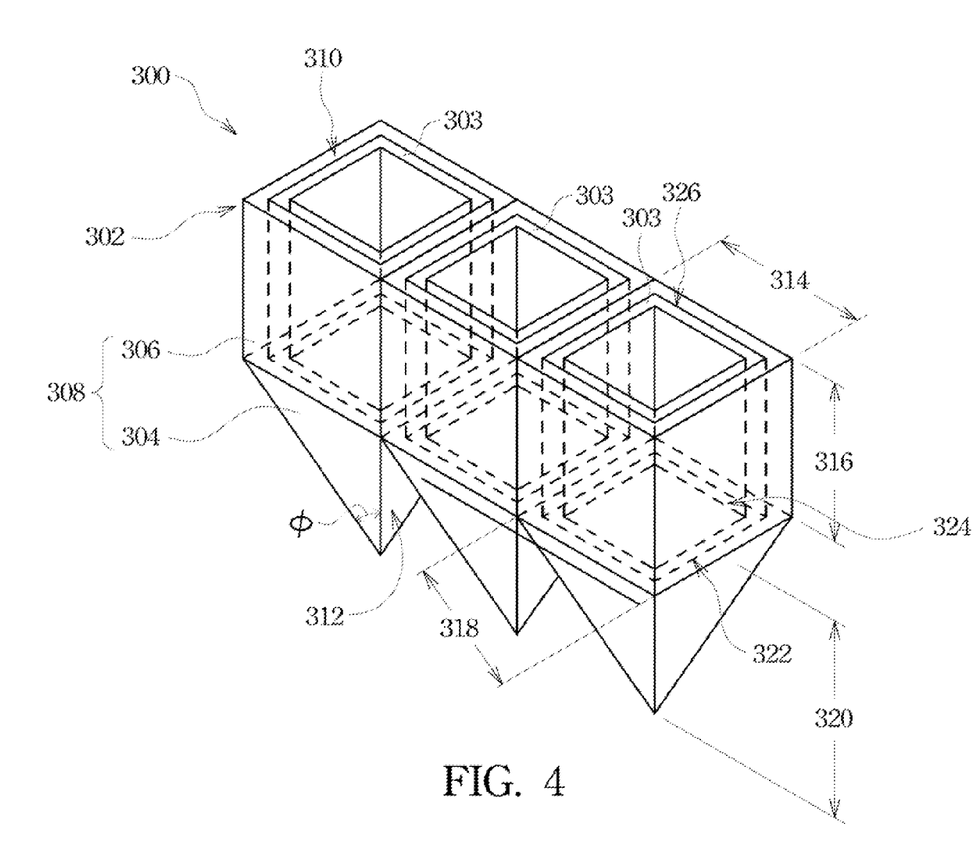
FIG. 4 is a three-dimensional drawing of a solar concentrator in accordance with still another embodiment of the present invention.

Refer to FIG. 4. FIG. 4 is a three-dimensional drawing of a solar concentrator in accordance with still another embodiment of the present invention. In the present embodiment, a solar concentrator 300 of a solar cell mainly includes a plane 302 and at least one photoelectric conversion layer 303. The material of the plane 302 may be a semiconductor material, such as silicon or glass. The plane 302 includes a plurality of concentrating elements 308. Each concentrating element 308 includes a hollow taper 304 and a hollow pillar 306. The photoelectric conversion layer 303 covers inner side surfaces of the concentrating elements 308, i.e. the photoelectric conversion layer 303 covers inner side surfaces of the hollow taper 304 and the hollow pillar 306. Each hollow taper 304 has an opening 322. In addition, each hollow pillar 306 includes openings 324 and 326 on two opposite ends of the hollow pillar 306. The opening 322 of the hollow taper 304 is correspondingly connected to the opening 324. In one embodiment, the shapes and the sizes of the opening 322 of the hollow taper 304 and the opening 324 of the hollow pillar 306 are the same to benefit the corresponding connection between the hollow taper 304 and the hollow pillar 306. In one example, the openings 326 of the hollow pillars 306 may be substantially located on the same level. For example, the openings 326 of all hollow pillars 306 are located on the same surface 310 of the plane 302, such as shown in FIG. 4. In one embodiment, an angle of a sidewall of each hollow pillar 306 may be, for example, between substantially 80 degrees and substantially 100 degrees. In another embodiment, the sidewall of each hollow pillar 306 may be vertical, and the angle of the sidewall of each hollow pillar 306 is 90 degrees, for example.

In one embodiment, the plane 302 may be a monolithic structure, and the concentrating elements 308 are formed in the plane 302. The plane 302 may be composed of the same material. In another embodiments, the plane 302 is not a monolithic structure and is formed by combining the concentrating elements 308.

Figure 5:
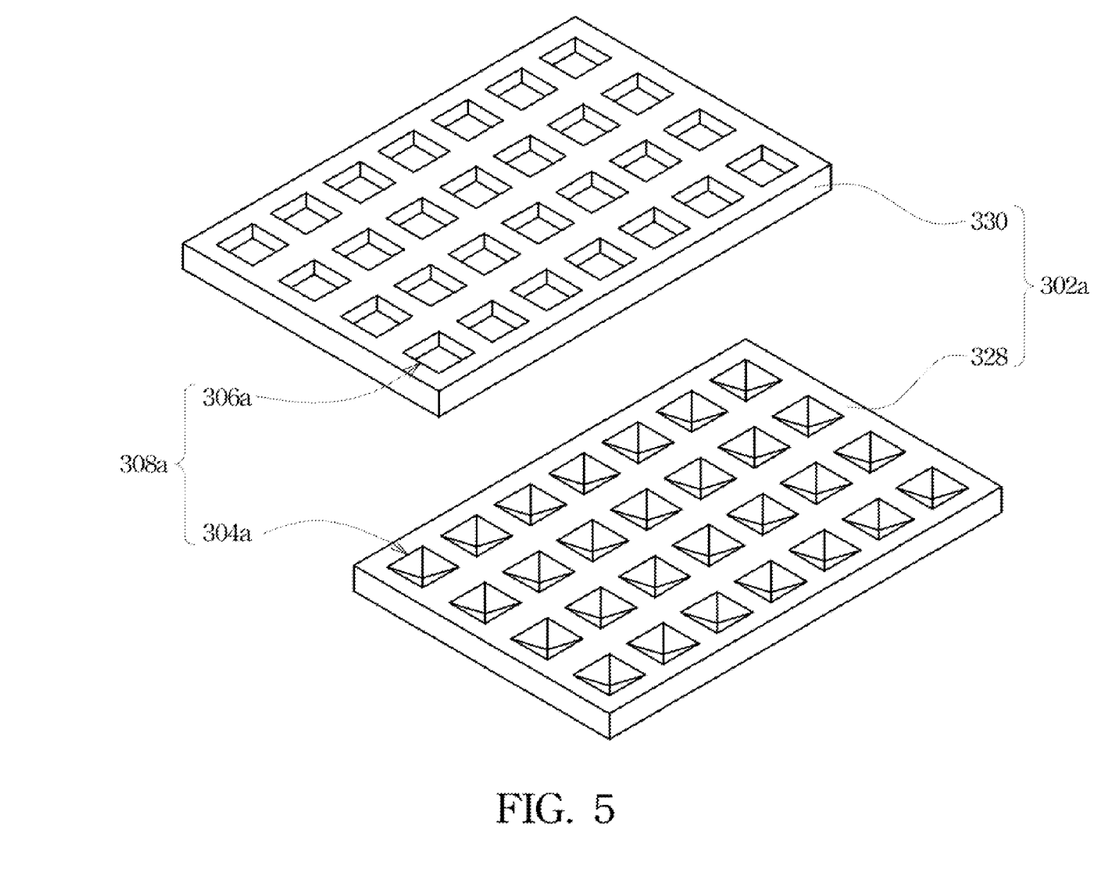
FIG. 5 is a schematic diagram showing the fabrication of a solar concentrator in accordance with still another embodiment of the present invention.

As shown in FIG. 5, in still another embodiment, a plane 302a includes two planes 328 and 330, wherein the plane 330 is stacked on the plane 328. The plane 330 is set with a plurality of hollow pillars 306a. The plane 328 is set with a plurality of hollow tapers 304a. The number, locations and sizes of the hollow tapers 304a are corresponding to those of the hollow pillars 306a. The planes 328 and 330 are aligned and stacked with each other by setting alignment marks (not shown) on the planes 328 and 330 to respectively correspondingly connect the hollow pillars 306a in the above plane 330 and the hollow tapers 304a in the underlying plane 328 to form a plurality of concentrating elements 308a.

In the present embodiment, each hollow taper 304 has a taper tip 312. A height 316 of the hollow pillar 306 may be equal to any value. However, when the height 316 is equal to zero, i.e. each concentrating element 308 only includes a hollow taper 304 without a hollow pillar 306, an angle $\phi$ of each taper tip 312 may be, for example, less than 90 degrees. When the height 316 is greater than zero, the angle $\phi$ of each taper tip 312 may be equal to any value.

In other embodiments, the hollow taper of the concentrating element of the solar concentrator may include at least two taper tips, such as the embodiment shown in FIG. 3. In one embodiment, the hollow taper 304 may be one of pyramids of different shapes, such as a hollow quadrangular pyramid shown in FIG. 4, a hollow triangular pyramid or a hollow polygon pyramid. The lengths of the sides of each pyramid may be the same or may be different, i.e. the pyramids may be regular pyramids or irregular pyramids. Corresponding to the hollow taper 304, the hollow pillar 306 may be a hollow quadrangular prism, a hollow triangular prism or a hollow polygon prism. In addition, the lengths of the sides of each prism may be the same or may be different, i.e. the prisms may be regular prisms or irregular prisms. In another embodiment, the hollow taper 304 may be a hollow cone or a hollow elliptic cone. Corresponding to the hollow taper 304, the hollow pillar 306 may be a hollow cylinder or a hollow elliptic cylinder.

Each concentrating element 308 of the solar concentrator 300 is composed of the hollow pillar 306 and the hollow taper 304, so that when the incident light, such as sunlight, is at a low angle relative to the surface 310 of the plane 302, the incident light can be effectively guided downward to broaden the collecting range of the solar concentrator 300, thereby achieving the object of increasing the light-collecting effect.

In one embodiment, the photoelectric conversion layer 303 of the concentrating element 308 of the solar concentrator 300 typically includes a p-type semiconductor layer, an n-type semiconductor layer and/or an i-type semiconductor layer, wherein the i-type semiconductor layer is usually placed in between the p-type semiconductor layer and the n-type semiconductor layer. After the fabrication of the solar concentrator 300, electrodes are formed to complete the fabrication of the solar cell.

Figure 6:
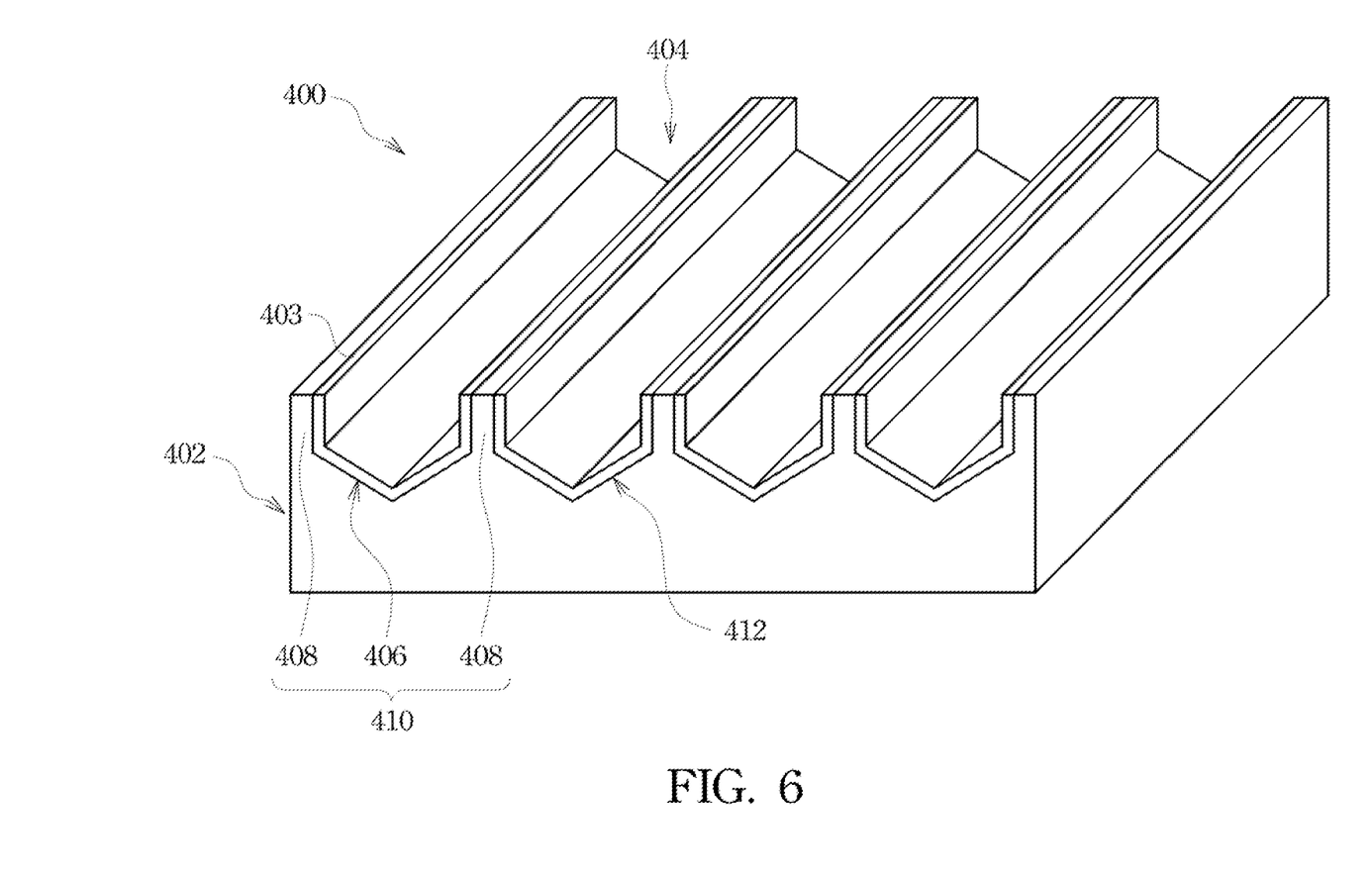
FIG. 6 is a three-dimensional drawing of a solar concentrator in accordance with further another embodiment of the present invention.

In other embodiments, the concentrating element of the solar concentrator may be in a form of a trench. Refer to FIG. 6. FIG. 6 is a three-dimensional drawing of a solar concentrator in accordance with further another embodiment of the present invention. In one embodiment, a solar concentrator 400 of a solar cell mainly includes a plane 402 and at least one photoelectric conversion layer 403. The material of the plane 402 may be a semiconductor material, such as silicon or glass. The plane 402 includes a plurality of concentrating elements 404. Each concentrating element 404 includes a trench 410. The photoelectric conversion layer 403 covers inner side surfaces of the concentrating elements 404, i.e. the photoelectric conversion layer 403 covers inner side surfaces of the trenches 410. In one concentrating element 404, the trench 410 includes a concave 406 and two sidewalls 408. The two sidewalls 408 are respectively connected to two opposite sides of the concave 406 and are opposite to each other. In one embodiment, each concave 406 may include a taper tip 412, and the trench 410 may be, for example, a U-like shaped trench.

In one embodiment, the plane 402 may be a monolithic structure, and the concentrating elements 404 are formed in the plane 402. The plane 402 may be composed of the same material. In another embodiment, the plane 402 is not a monolithic structure and is formed by combining the concentrating elements 404.

Figure 7:
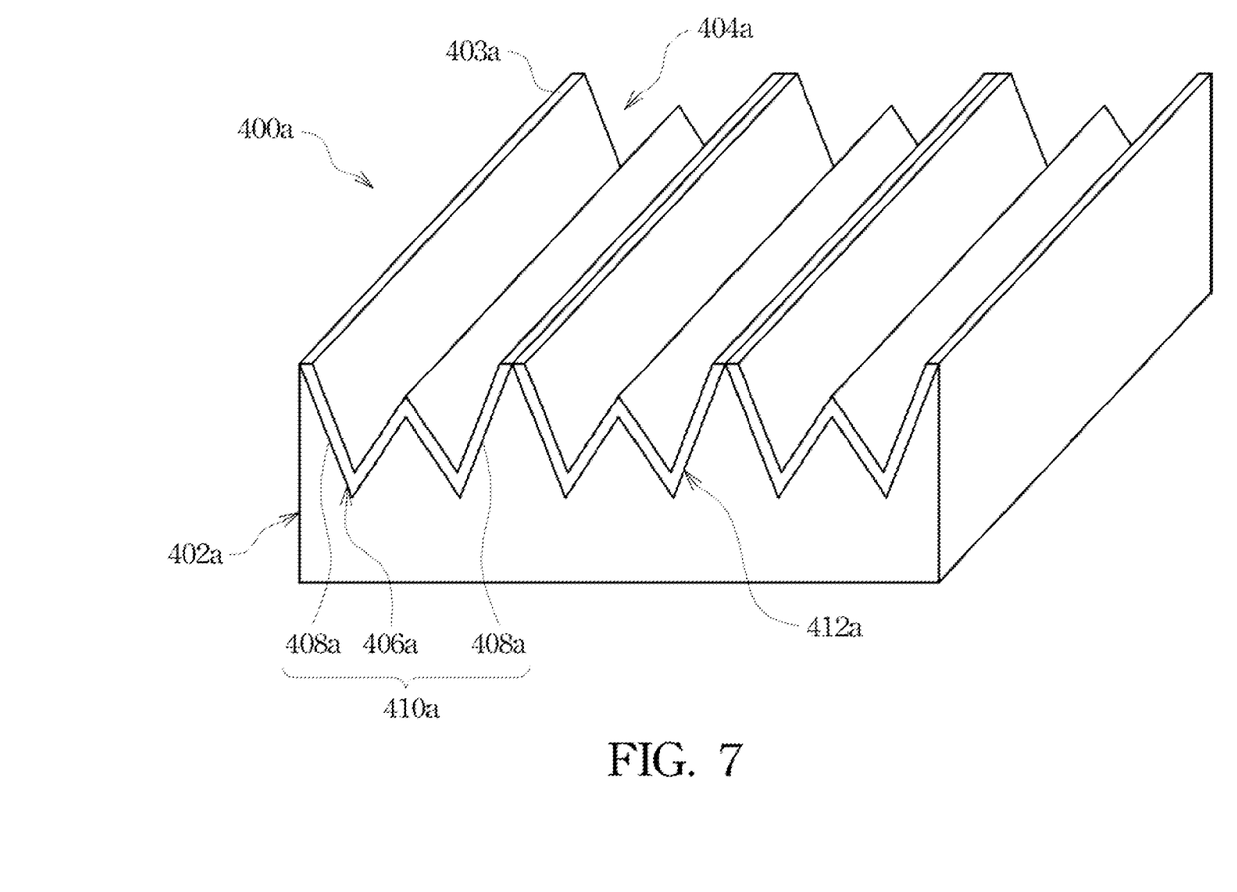
FIG. 7 is a three-dimensional drawing of a solar concentrator in accordance with still further yet another embodiment of the present invention.

In other embodiments, the trench of the concentrating element of the solar concentrator may include at least two taper tips. Refer to FIG. 7. FIG. 7 is a three-dimensional drawing of a solar concentrator in accordance with still further yet another embodiment of the present invention. In one embodiment, a solar concentrator 400a of a solar cell mainly includes a plane 402a and at least one photoelectric conversion layer 403a. The material of the plane 402a may be a semiconductor material, such as silicon or glass. The plane 402a includes a plurality of concentrating elements 404a. Each concentrating element 404a includes a trench 410a. The photoelectric conversion layer 403a covers inner side surfaces of the concentrating elements 404a, i.e. the photoelectric conversion layer 403a covers inner side surfaces of the trenches 410a. In one concentrating element 404a, the trench 410a includes a concave 406a and two sidewalls 408a. The two sidewalls 408a are respectively connected to two opposite sides of the concave 406 and are opposite to each other. In one embodiment, each concave 406a may include two taper tips 412a, and the trench 410a may be, for example, a W-shaped trench.

In one embodiment, the plane 402a may be a monolithic structure, and the concentrating elements 404a are formed in the plane 402a. The plane 402a may be composed of the same material. In another embodiment, the plane 402a is not a monolithic structure and is formed by combining the concentrating elements 404a.

In the present invention, each solar concentrator may selectively include a cover to cover all concentrating elements according to a practical need, such as the embodiment shown in FIG. 3, so as to prevent the light-collecting efficiency of the concentrating elements from being decreased due to contamination.

Figure 8:
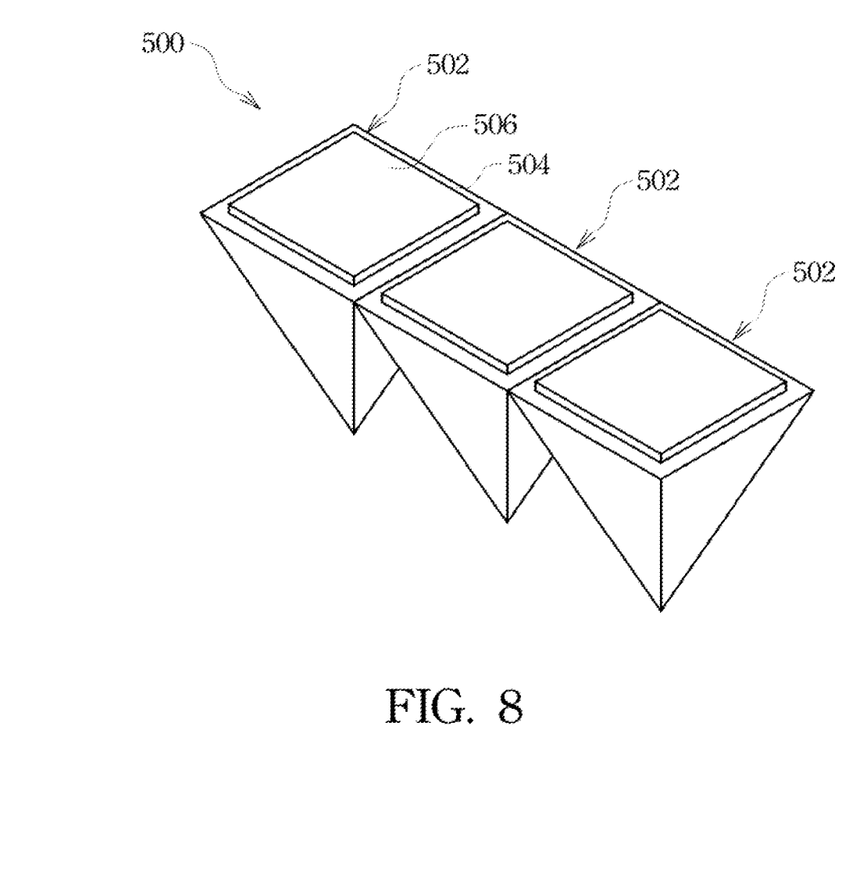
FIG. 8 is a three-dimensional drawing of a solar concentrator in accordance with still further another embodiment of the present invention.
Figure 9:
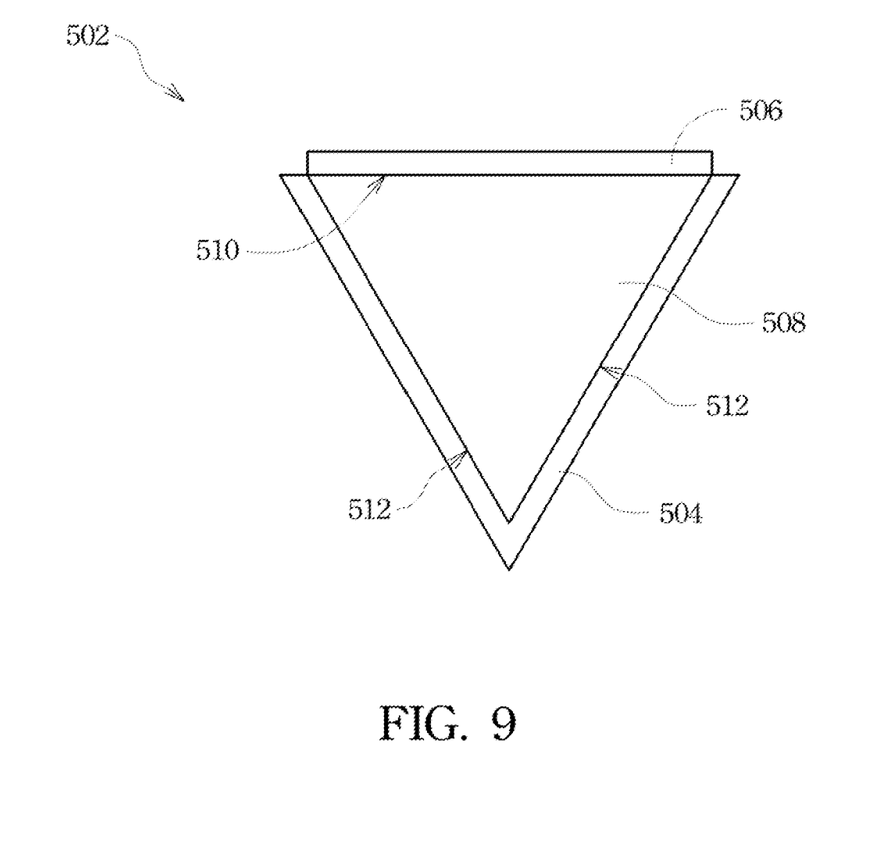
FIG. 9 illustrates a cross-sectional view of a concentrating element of a solar concentrator in accordance with still further another embodiment of the present invention.

Simultaneously refer to FIG. 8 and FIG. 9. FIG. 8 and FIG. 9 respectively illustrate a three-dimensional drawing of a solar concentrator in accordance with still further another embodiment of the present invention, and a cross-sectional view of the concentrating element of the solar concentrator. In the preset embodiment, a solar concentrator 500 of a solar cell includes at least one concentrating element 502. In the exemplary embodiment shown in FIG. 8, the solar concentrator 500 is composed of a plurality of concentrating elements 502.

As shown in FIG. 9, each concentrating element 502 mainly includes a taper 508 and a photoelectric conversion layer 504. The material of the taper 508 may be a transparent material to allow light to pass through. In the exemplary embodiment shown in FIG. 8 and FIG. 9, the taper 508 is a quadrangular pyramid, so that the taper 508 includes a light-entering surface 510 and a plurality of light-concentrating surfaces 512. The light-entering surface 510 is one side surface of the taper 508, the light-concentrating surfaces 512 are other side surfaces of the taper 508, and the light-concentrating surfaces 512 are adjacently connected to the light-entering surface 510. In another embodiments, the taper 508 may be a triangular pyramid or a polygon pyramid, and the triangular pyramid or the polygon pyramid similarly includes a light-entering surface and a plurality of light-concentrating surfaces.

In another embodiment, the taper of the concentrating element may be a cone or an elliptic cone, and the cone or an elliptic cone includes a light-entering surface and a light-concentrating surface. The light-entering surface is a flat surface of the cone or the elliptic cone, and the light-concentrating surface is a side surface of the cone or the elliptic cone and is adjacently connected to the light-entering surface.

Referring to FIG. 9 again, the photoelectric conversion layer 504 of the concentrating element 502 covers all light-concentrating surfaces 512, wherein the photoelectric conversion layer 504 has an ability of absorbing light to generate electric energy. The photoelectric conversion layer 504 of the concentrating element 502 of the solar concentrator 500 typically includes a p-type semiconductor layer, an n-type semiconductor layer and/or an i-type semiconductor layer (not shown), wherein the i-type semiconductor layer is usually placed in between the p-type semiconductor layer and the n-type semiconductor layer. In one exemplary embodiment, the concentrating element 502 may selectively include an anti-reflective structure 506, wherein the anti-reflective structure 506 covers the light-entering surface 510 of the taper 508 to make the light successfully enter the taper 508 through the light-entering surface 510 to enhance the light-collecting efficiency of the concentrating element 502. The anti-reflective structure 506 may be an anti-reflective film coated on the light-entering surface 510 of the taper 508, or an anti-reflective microstructure formed on the light-entering surface 510 by performing a surface treatment on the light-entering surface 510 of the taper 508.

Referring to FIG. 8 and FIG. 9, each concentrating element 502 of the solar concentrator 500 is composed of a transparent taper 508, so that when the incident light, such as sunlight, is at a low angle relative to the light-entering surface 510 of the taper 508 of the concentrating element 502, the incident light can be guided downward to make the incident light collide with the photoelectric conversion layers 504 on the light-concentrating surfaces 512 of the taper 508 many times to enhance the light-absorbing efficiency, so as to broaden the effective collecting range of the incident light, thereby effectively increasing the photoelectric conversion efficiency.

Figure 10:
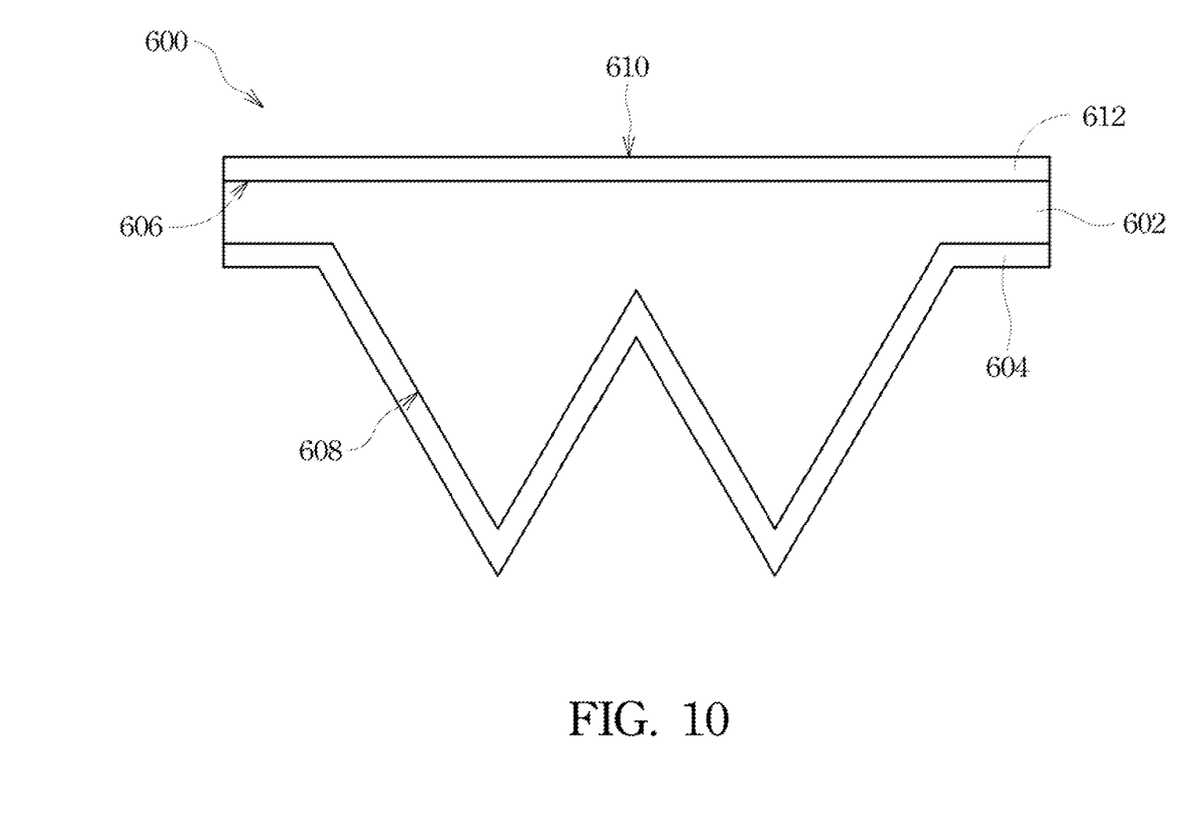
FIG. 10 illustrates a cross-sectional view of a concentrating element of a solar concentrator in accordance with yet another embodiment of the present invention.

Refer to FIG. 10. FIG. 10 illustrates a cross-sectional view of a concentrating element of a solar concentrator in accordance with yet another embodiment of the present invention. In the present embodiment, a solar concentrator 600 includes at least one concentrating element 610. Each concentrating element 610 mainly includes at least one pillar 602 and a photoelectric conversion layer 604, wherein the material of the pillar 602 may be a transparent material to allow light to pass through. In one exemplary embodiment, the pillar 602 includes a light-entering surface 606 and a plurality of light-concentrating surfaces 608, wherein the light-entering surface 606 is one side surface of the pillar 602, the light-concentrating surfaces 608 are other side surfaces of the pillar 602, and the light-concentrating surfaces 608 and the light-entering surface 606 are located on two opposite sides of the pillar 602. In the exemplary embodiment shown in FIG. 10, the light-concentrating surfaces 608 of the pillar 602 form a W-shaped contour. In another embodiments, the light-concentrating surfaces of the pillar may form a V-shaped contour or a U-like shaped contour.

The photoelectric conversion layer 604 of the concentrating element 610 covers all light-concentrating surfaces 608 of the pillar 602, wherein the photoelectric conversion layer 604 has an ability of absorbing light to generate electric energy. In one exemplary embodiment, the concentrating element 610 may selectively include an anti-reflective structure 612, wherein the anti-reflective structure 612 covers the light-entering surface 606 of the pillar 602 to make the light successfully enter the pillar 602 through the light-entering surface 606 to enhance the light-collecting efficiency of the concentrating element 610. Similarly, the anti-reflective structure 612 may be an anti-reflective film coated on the light-entering surface 606 of the pillar 602, or an anti-reflective microstructure formed on the light-entering surface 606 by performing a surface treatment on the light-entering surface 606 of the pillar 602.

Referring to FIG. 10 again, each concentrating element 610 of the solar concentrator 600 is composed of a transparent pillar 602, so that when the incident light, such as sunlight, is at a low angle relative to the light-entering surface 606 of the pillar 602 of the concentrating element 610, the incident light can be guided downward to make the incident light collide with the photoelectric conversion layer 604 on the light-concentrating surfaces 608 of the pillar 602 many times to enhance the light-absorbing efficiency, so as to broaden the effective collecting range of the solar concentrator 600, thereby effectively increasing the photoelectric conversion efficiency.

Figure 11:
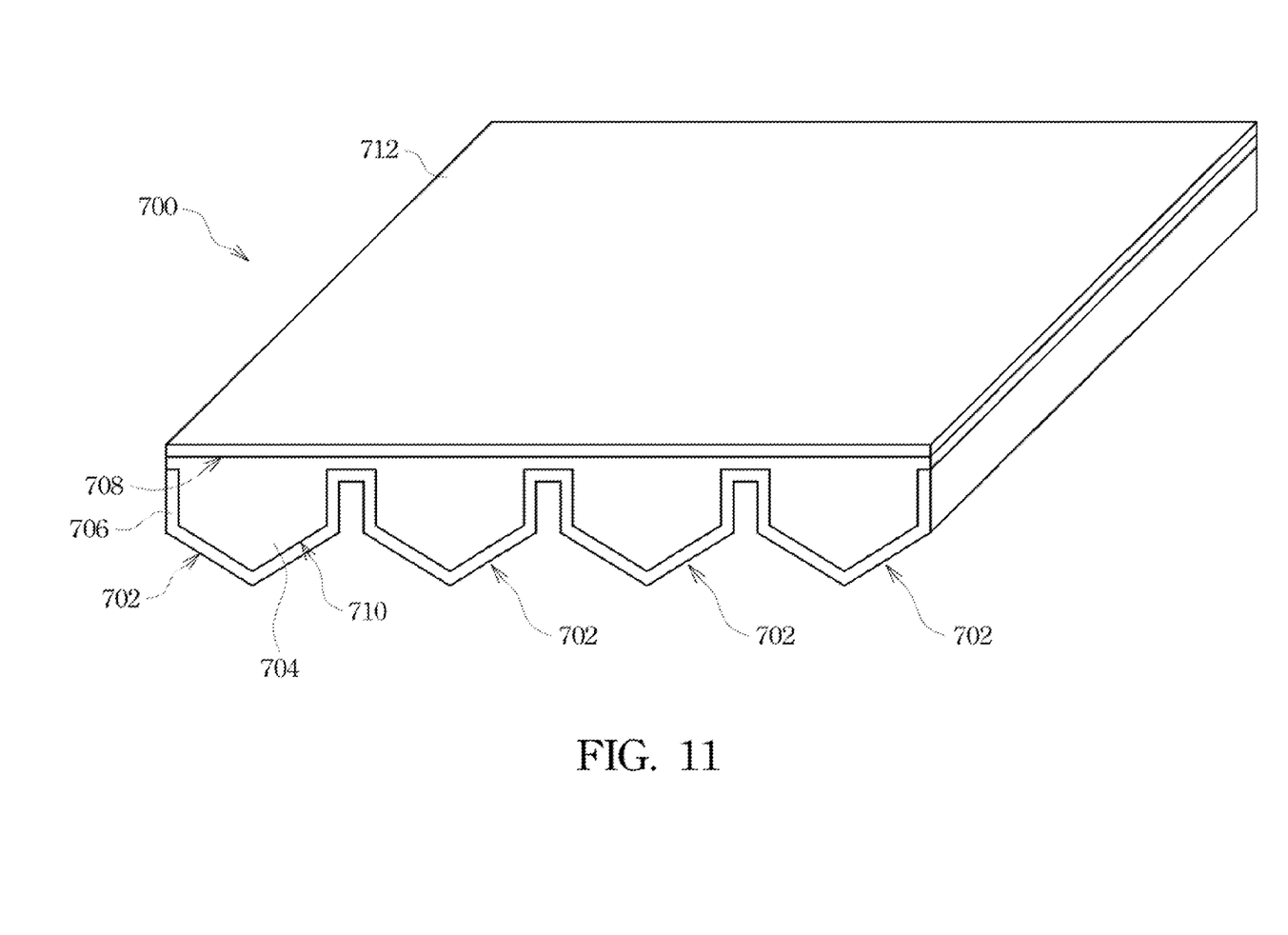
FIG. 11 is a three-dimensional drawing of a solar concentrator in accordance with yet another embodiment of the present invention.

Refer to FIG. 11. FIG. 11 is a three-dimensional drawing of a solar concentrator in accordance with yet another embodiment of the present invention. In the present embodiment, a solar concentrator 700 includes a plurality of concentrating elements 702. Each concentrating element 702 mainly includes a pillar 704 and a photoelectric conversion layer 706, wherein the material of the pillar 704 may be a transparent material. In one exemplary embodiment, the pillar 704 includes a light-entering surface 708 and a plurality of light-concentrating surfaces 710, wherein the light-entering surface 708 is one side surface of the pillar 704, the light-concentrating surfaces 710 are other side surfaces of the pillar 704, and the light-concentrating surfaces 710 and the light-entering surface 718 are located on two opposite sides of the pillar 704. In the exemplary embodiment shown in FIG. 11, the light-concentrating surfaces 710 of the pillar 704 form a U-like shaped contour.

The photoelectric conversion layer 706 of the concentrating element 702 covers all light-concentrating surfaces 710 of the pillar 704. In one exemplary embodiment, the concentrating element 702 may selectively include an anti-reflective structure 712, wherein the anti-reflective structure 712 covers the light-entering surface 708 of the pillar 704 to make the light successfully enter the pillar 704 through the light-entering surface 708. Similarly, the anti-reflective structure 712 may be an anti-reflective film coated on the light-entering surface 708 of the pillar 704, or an anti-reflective microstructure formed on the light-entering surface 708 by performing a surface treatment on the light-entering surface 708 of the pillar 704.

According to the aforementioned embodiments, one advantage of the present invention is that a solar concentrator of the present invention includes a plurality of concentrating elements, and each concentrating element includes a hollow taper, so that the range of collecting the incident light can be enlarged, and the solar concentrator has a very superior light-collecting ability.

According to the aforementioned embodiments, another advantage of the present invention is that a solar concentrator of the present invention includes a plurality of concentrating elements, and each concentrating element includes a hollow taper and a hollow pillar communicating with each other, so that the range of collecting the incident light can be broadened, thereby greatly increasing the light-absorbing effect.

According to the aforementioned embodiments, still another advantage of the present invention is that each concentrating element of a solar concentrator of the present invention includes a U-like shaped trench or a W-shaped trench. Two sidewalls of each of the U-like shaped trench and the W-shaped trench can increase the range of collecting the incident light of the solar concentrator, and can guide the incident light toward a bottom of the trench to increase the collision frequency between the incident light and a photoelectric conversion layer of the solar concentrator. Therefore, the light-absorbing efficiency can be increased to effectively enhance the photoelectric conversion efficiency.

According to the aforementioned embodiments, further another advantage of the present invention is that a solar concentrator of the present invention includes at least one concentrating element, and each concentrating element includes a taper, wherein a light-entering surface and a light-concentrating surface are respectively disposed on different side surfaces of the taper. With the design of the taper, the range of collecting the incident light can be enlarged, so that the solar concentrator has a very superior light-collecting ability.

According to the aforementioned embodiments, yet another advantage of the present invention is that each concentrating element of a solar concentrator of the present invention includes at least one pillar, and two opposite sides of each concentrating element include a light-entering surface and a plurality of light-concentrating surfaces. With the design of the pillar, the range of collecting the incident light can be broadened, and the incident light can be guided toward the light-concentrating surfaces on another side to increase the collision frequency between the incident light and an photoelectric conversion layer of the solar concentrator. Therefore, the light-absorbing efficiency can be increased to effectively enhance the photoelectric conversion efficiency. Accordingly, the solar concentrator of the present invention has a large collecting range of the incident light and a very superior light-absorbing effect.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A solar concentrator and photoelectric conversion structure, including:
    a glass concentrator that forms a light incident surface and a plane, the plane including a plurality of concentrating elements,
    wherein each of the concentrating elements includes a trench, and each trench includes:
    a feature that is concaved in respect to a light incident surface, including a first inclined flat surface and a second inclined flat surface,
    wherein each of the first inclined flat surface and the second inclined flat surface includes a first edge and a second edge opposite to each other, the first edge of the first inclined flat surface is directly connected to the first edge of the second inclined flat surface; and
    a first sidewall and a second sidewall are connected to the first and second inclined flat surfaces, respectively, and opposite to each other;
    wherein each of the first and second sidewalls include a first edge and a second edge, the first edge of the first sidewall is directly connected to the second edge of the first inclined flat surface and the first edge of the second sidewall is directly connected to the second edge of the second inclined flat surface, and the sidewalls stand upright on the concaved feature with the second edge of the first sidewall and the second edge of the second sidewall adjacent to the light incident surface; and a photoelectric conversion layer is deposited onto the internal surfaces of each trench of the concentrating elements, including the first and second sidewalls and the first and second inclined flat surfaces, wherein the photoelectric conversion layer includes at least a p-type material and an n-type material.

2. The solar concentrator and photoelectric conversion structure according to claim 1, wherein the concentrator forming the plane is a monolithic structure.

3. The solar concentrator and photoelectric conversion structure according to claim 1, wherein the concentrator forming the plane is a combination of the concentrating elements.

4. The solar concentrator and photoelectric conversion structure according to claim 1, further including a cover covering the concentrating elements.

5. The solar concentrator and photoelectric conversion structure according to claim 4, wherein the cover includes an anti-reflective surface.

* * * * *